(12) United States Patent
Jaussi et al.

(10) Patent No.: US 6,747,490 B1
(45) Date of Patent: Jun. 8, 2004

(54) SAMPLING PULSE GENERATION

(75) Inventors: James E. Jaussi, Hillsboro, OR (US); Bryan K. Casper, Hillsboro, OR (US); Joseph T. Kennedy, Beaverton, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/328,205

(22) Filed: Dec. 23, 2002

(51) Int. Cl.[7] ............................................. H03K 3/289
(52) U.S. Cl. ..................... 327/116; 327/296; 327/202
(58) Field of Search ................................ 327/158, 156, 327/202, 200, 116, 296, 213

(56) References Cited

U.S. PATENT DOCUMENTS 4,686,677 A * 8/1987 Flora ............................ 371/61
5,561,423 A * 10/1996 Morisaki ..................... 341/100
5,740,410 A * 4/1998 McDermott ................. 327/113
6,242,958 B1 * 6/2001 Fletcher ....................... 327/202

* cited by examiner

*Primary Examiner*—Dinh T. Le
(74) *Attorney, Agent, or Firm*—Buckley, Maschoff and Talwalkar LLC

(57) ABSTRACT

According to some embodiments, a circuit provides a first set of one or more flip-flops to receive a low-swing differential clock, and a second set of one or more flip-flops to receive the low-swing differential clock. One of the one or more flip-flops of the first set is to generate a first CMOS-level sampling pulse for each cycle of the low-swing differential clock, and wherein one of the one or more flip-flops of the second set is to generate a second CMOS-level sampling pulse for each cycle of the low-swing differential clock.

25 Claims, 6 Drawing Sheets

SAMPLING PULSE GENERATION

BACKGROUND

Data signals are commonly transmitted and received in conjunction with associated clock signals. A clock signal allows a receiver to extract data from a data signal by defining the bit-cell boundaries of the data signal. Clock signals are controlled by clocking circuits that are associated with data-carrying communication links.

A clocking circuit that is associated with a communication link is ideally capable of supporting any data rate that can be supported by the communication link and its associated transmitter and receiver. However, the speed and performance of a communication link are often limited by its clocking circuit. More specifically, a communication link may be prevented from carrying data at a particular rate because an associated clocking circuit is unable to generate clocking signals that define bit-cell lengths required by the data rate. Consequently, circuit designers desire clocking systems that support data rates that are greater than those supported by current clocking systems.

DETAILED DESCRIPTION

Figure 1:
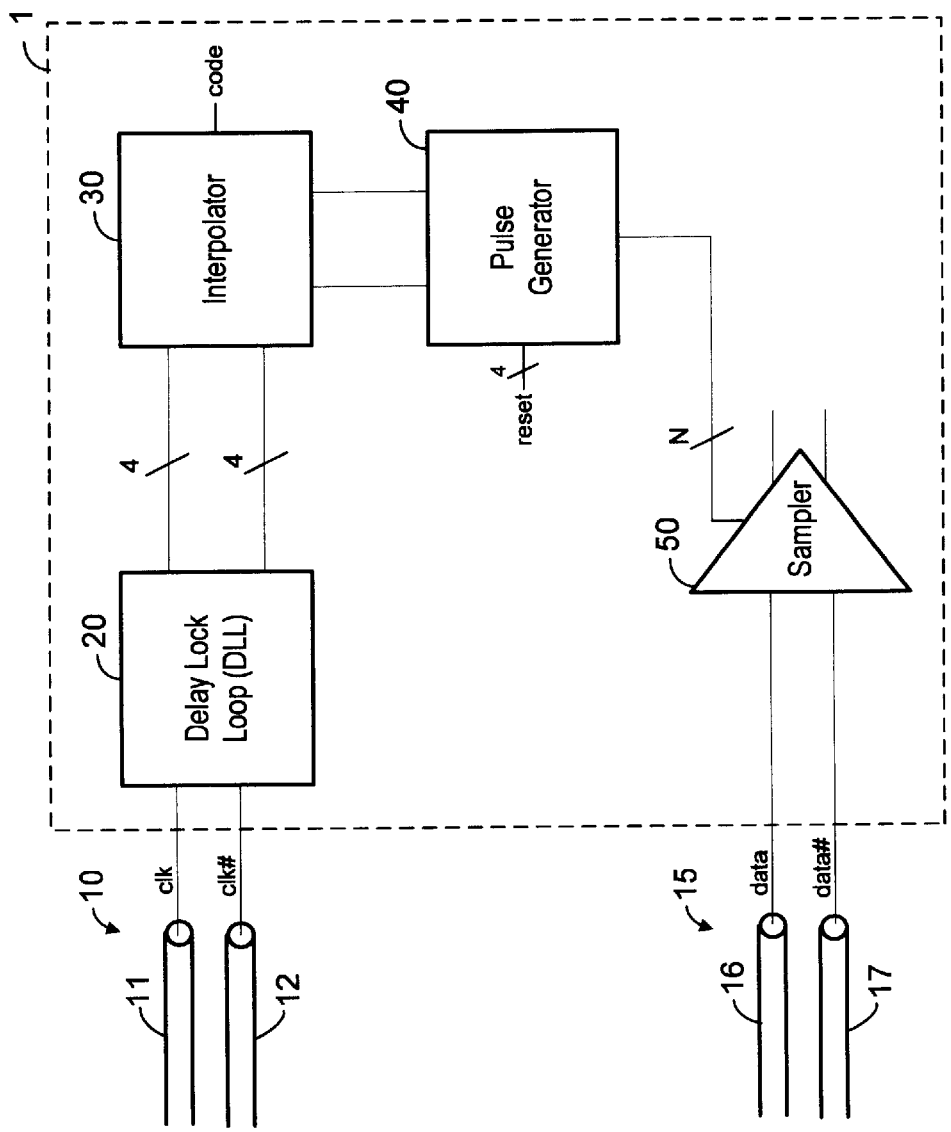
FIG. 1 is a block diagram illustrating a receiver according to some embodiments.

FIG. 1 is a block diagram of receiver 1 according to some embodiments. Receiver 1 is coupled to communication lines 10 to receive a differential-mode clock signal and to communication lines 15 to receive a differential-mode data signal. More particularly, communication line 11 of communication lines 10 carries a first component (clk) of the differential clock signal, communication line 12 of communication lines 10 carries a second component (clk#) of the differential clock signal, communication line 16 of communication lines 15 carries a first component (data) of the differential data signal, and communication line 17 of communication lines 15 carries a second component (data#) of the differential data signal.

Delay Lock Loop (DLL) 20 comprises a low-swing differential DLL. DLL 20 generally comprises a current source, a differential input, an active device load, and delay elements for shifting a phase of a received differential signal. In principle, DLL 20 progressively shifts a phase of a received signal until the signal has been shifted 180 degrees (or a multiple thereof). The finally-shifted version of the signal may then be easily compared to the received signal in order to determine whether DLL 20 accurately performed the intermediate phase shifts. If not, DLL 20 self-corrects its shifting functions to ensure that the finally-shifted version of the received signal matches (or is an inverse of) the received signal.

Accordingly, DLL 20 receives the differential clock signal from communication lines 15 and generates two or more shifted versions, or phases, of the differential clock signal. In the present example, DLL 20 generates four phases of the low-swing differential clock signal. The four phases are associated with phase angles of 180, 225, 270 and 305 degrees, respectively.

Interpolator 30 is coupled to DLL 20 and receives the plurality of low-swing differential clock signal phases therefrom. Interpolator 30 generates a single low-swing differential clock signal having a particular phase based on the received phases and on a received code. The code indicates the clock signal phase that should be used to sample the data signal carried by communication lines 20.

In the present example, communication lines 10 and 15 are coupled as a source-synchronous link. Accordingly, the rising edges of the differential clock signal carried by communication lines 10 are synchronized with the beginning of bit-cells reflected in the differential data carried by communication lines 15. The code therefore indicates a phase of the clock signal for which each rising edge is synchronized with the middle of the bit-cells. This phase may also take into account relative phase shifts caused by differences in the signal paths traveled by the differential clock and data signals.

In a case that the code indicates a phase that is not received from DLL 20, interpolator 30 interpolates between two or more of the received phases to generate the required phase. The generated phase is then transmitted as a low-swing differential clock signal to pulse generator 40.

Pulse generator 40 receives the low-swing differential clock signal and generates one or more CMOS-level sampling pulses based thereon. According to some embodiments, the sampling rate is greater than a frequency of the low-swing differential clock signal. The sampling pulse(s) may be differential, single-ended, or pseudo-differential.

Sampler 50 receives the generated sampling pulse(s) from phase generator 40 and the differential data signal from communication lines 15. Accordingly, sampler 50 samples the differential data signal based on the sampling pulse(s). Since the frequency of the sampling pulse(s) is greater than the frequency of the differential clock signal carried by communication lines 10, the data rate of the differential data signal may be greater than the clock rate of the differential clock signal.

Figure 2:
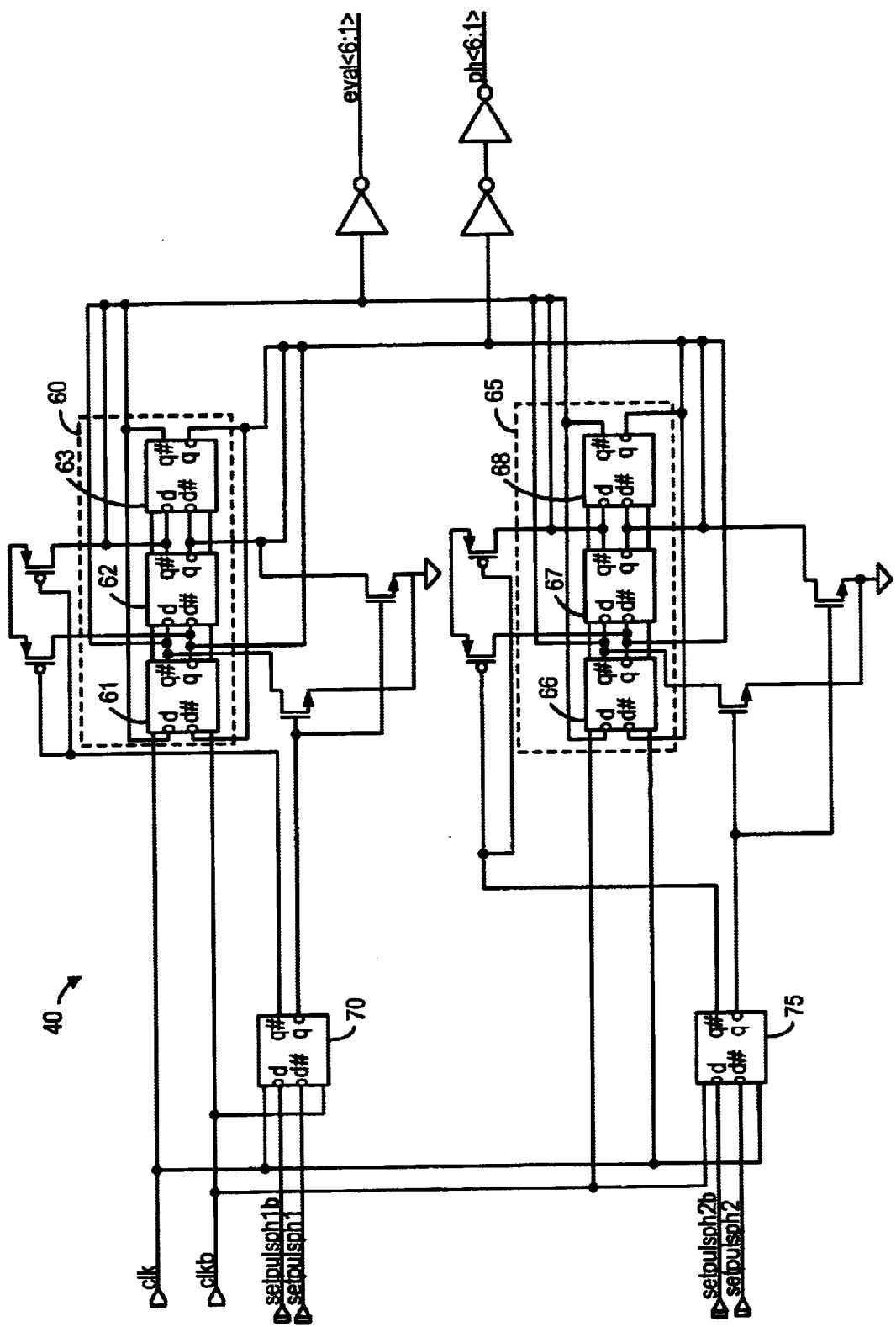
FIG. 2 is a circuit diagram of a pulse generator according to some embodiments.

FIG. 2 is a circuit diagram of pulse generator 40 according to some embodiments. As described above, pulse generator 40 may receive a low-swing differential clock signal from interpolator 30 and generate CMOS-level sampling pulses based thereon. Pulse generator 40 of FIG. 2 includes flip-flop set 60, comprising flip-flops 61 through 63, and flip-flop set 65, comprising flip-flops 66 through 68. Each of flip-flops 61 through 63 and flip-flops 66 through 68 is adapted to generate a CMOS-level sampling pulse based on a low-swing differential clock signal. An implementation of a flip-flop according to some embodiments will be discussed below with respect to FIG. 4.

Generally, each of flip-flops 61 through 63 is triggered by a particular event that occurs during one clock cycle, and each of flip flops 66 through 68 is triggered by another event that also occurs during a single clock cycle. This general functionality may be implemented in many ways. In the FIG. 2 arrangement, each of flip-flops 61 through 63 is triggered by a positive edge of the clk signal, while each of flip-flops 66 through 68 is triggered by a positive edge of the clk# signal. In other embodiments, each of flip-flops 61 through 63 is triggered by a positive edge of the clk signal, while each of flip-flops 66 through 68 is triggered by a negative edge of the clk signal. Other arrangements will be apparent from this description to those skilled in the art.

According to the illustrated embodiment, each of flip-flops 61 through 63 and each of flip-flops 66 through 68 enters an initial state dictated by two differential reset signals. The first differential reset signal is received by flip-flop 70 and the second differential reset signal is received by flip-flop 75. Flip-flops 70 and 75 are employed to ensure that the reset signals are in the domain of the differential clock signal. The reset signals force each set of flip-flops 60 and 65 to initial states of, from left to right, "1", "0" and "0". With each triggering of a set of flip-flops, the initial states are barrel-shifted to the right. For example, the three states following the initial state are, again from left to right, "010", "001" and "100".

By virtue of the foregoing arrangement, CMOS-level sampling pulses are generated alternately by one of flip-flop set 60 and one of flip-flop set 65. The frequency of the sampling pulses is twice the frequency of the input low-swing differential clock signal. Moreover, each flip-flop of each flip-flop set generates one of every six sampling pulses. For example, pulses are generated in turn by flip-flops 61, 66, 62, 67, 63 and 68.

Figure 3:
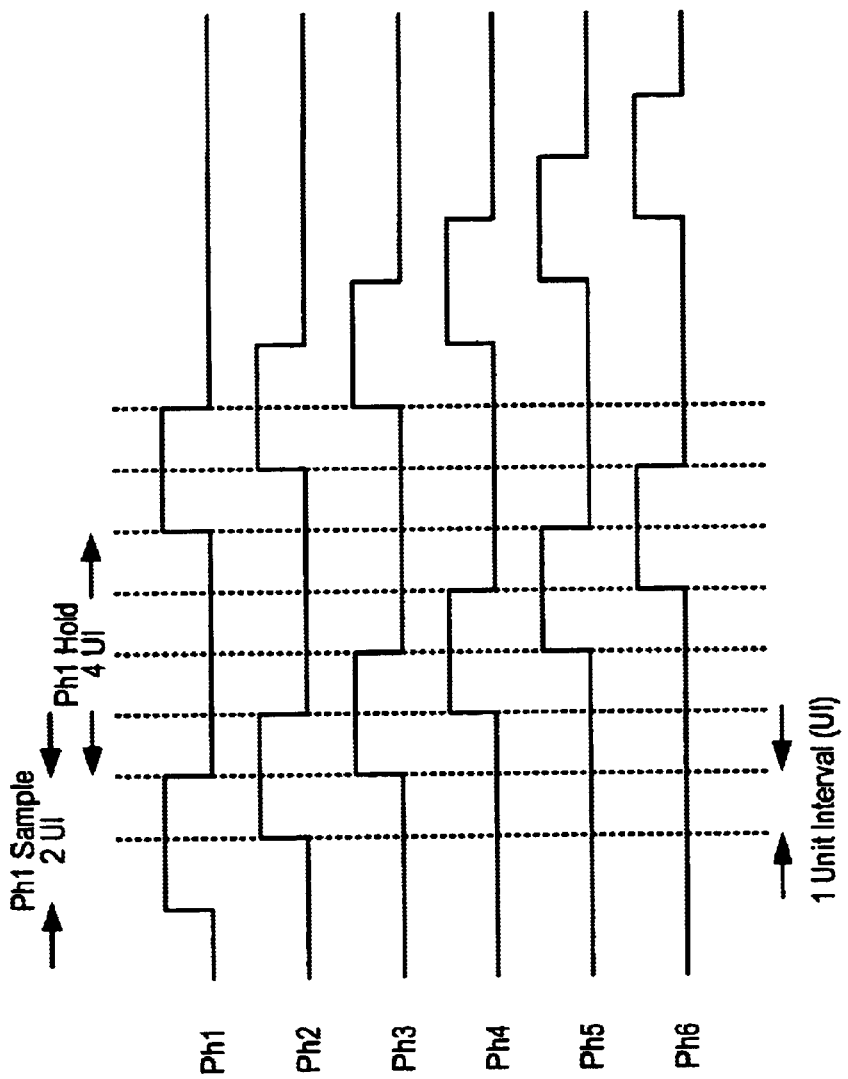
FIG. 3 is timing diagram of sampling pulses according to some embodiments.

FIG. 3 illustrates a timing diagram of sampling pulses generated by pulse generator 40 of FIG. 2 according to some embodiments. As shown, the differential clock signals represented by clk and clk# each have a period of 2 Unit Intervals (UI) and the period of the sampling pulses, taken together, is 1 UI. The period of the sampling pulses may match the bit-cell length of the differential data signal, thereby providing sampling of the differential data signal at twice the frequency of the clock signal. FIGS. 2 and 3 reflect three flip-flops in each of flip-flop sets 60 and 65 because sampler 50 accepts six different input lines carrying interleaved sampling signals of the desired net frequency. However, some embodiments comprise flip-flop sets of one, two, four or more flip-flops.

Figure 4:
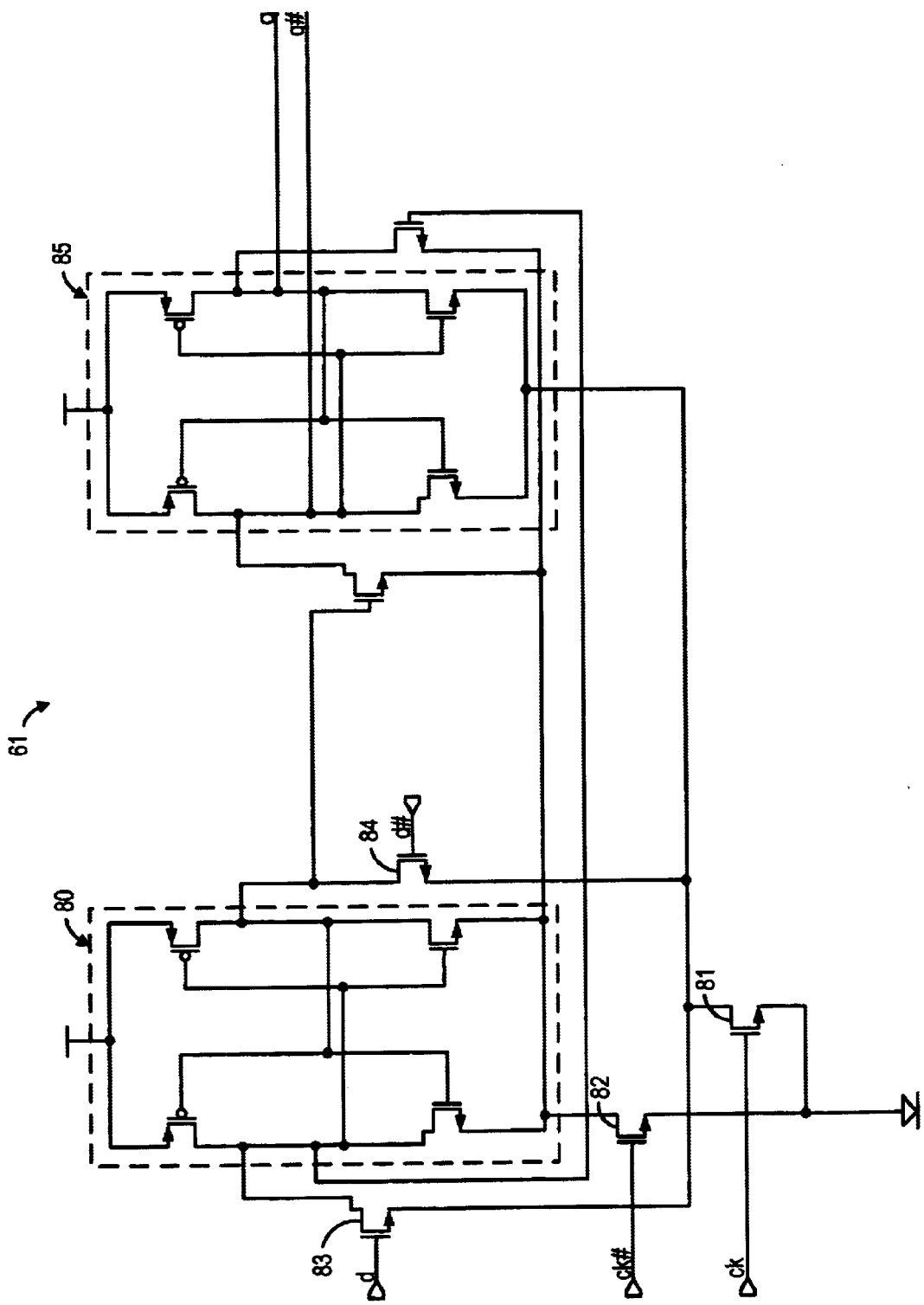
FIG. 4 is a circuit diagram of a flip-flop according to some embodiments.

FIG. 4 is a circuit diagram of flip-flop 61 according to some embodiments. Flip-flop 61 includes jam latch 80 and jam latch 85 coupled in a master-slave arrangement. Flip-flop 61 of FIG. 4 is adapted to receive a low-swing differential clock signal and to generate a CMOS-level sampling pulse based thereon.

Flip-flop 61 includes n-channel metal oxide semiconductor (NMOS) transistor 81 and NMOS transistor 82. A drain terminal of transistor 81 is coupled directly to jam latch 80 and a drain terminal of transistor 82 is coupled directly to jam latch 85. Moreover, source terminals of transistors 81 and 82 are coupled to one another. Gate terminals of NMOS transistors 83 and 84 receive signals d and d#, respectively. Signals d and d# control a state of flip-flop 61 in conjunction with a low-swing differential clock signal.

In operation, the clk component of the low-swing differential clock signal is applied to a gate terminal of transistor 81 via the ck signal line, while the clk# component of the low-swing differential clock signal is applied to a gate terminal of transistor 82 via the ck# signal line. In a case that clk# is high, the devices of jam latch 80 are active and jam latch 80 is enabled. Jam latch 80 will therefore hold a data value independent of the values of d and d#. NMOS devices of jam latch 80 become inactive once clk# goes low, in which case jam latch 80 will stabilize to a data value that is dependent on the values of d and d#.

Figure 5:
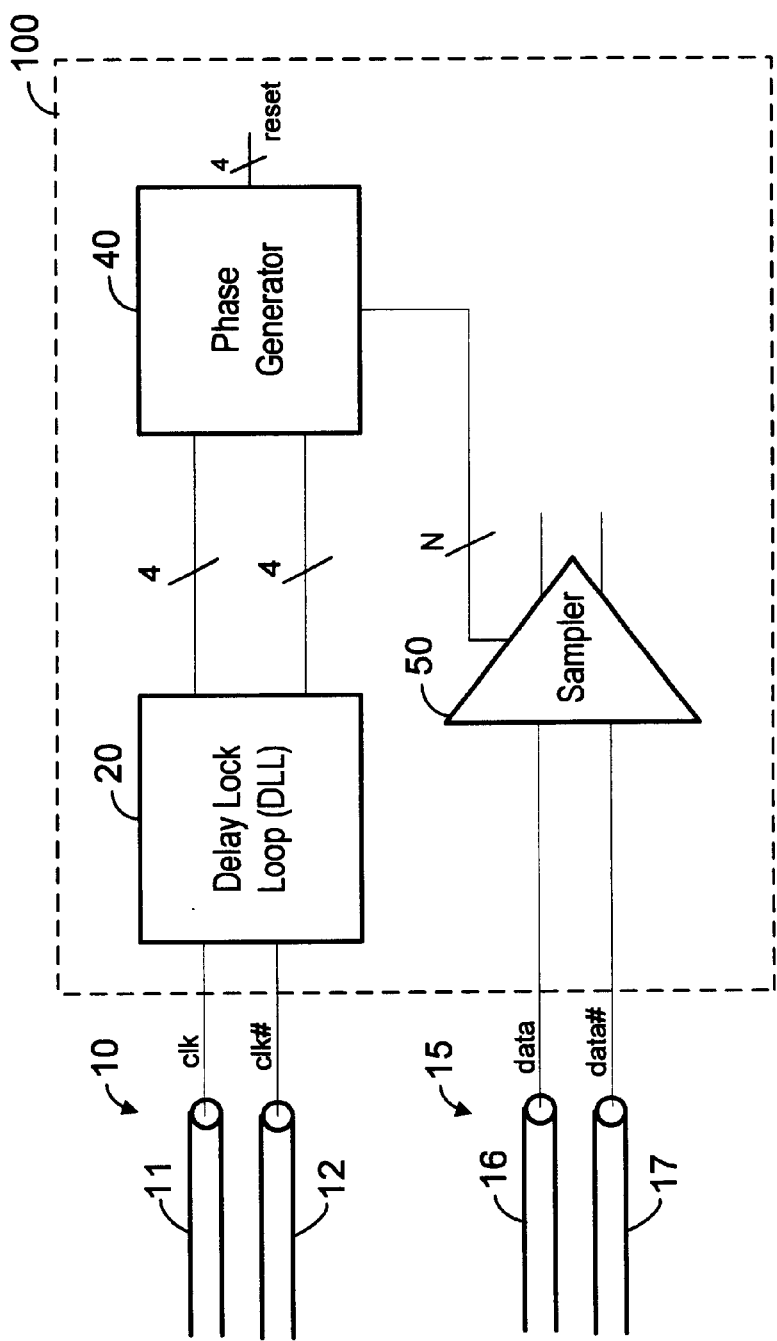
FIG. 5 is a block diagram illustrating a receiver according to some embodiments.

FIG. 5 is a block diagram of receiver 100 according to some embodiments. Like receiver 1, receiver 100 is coupled to communication lines 10 and 15 and includes DLL 20 and pulse generator 40. Unlike receiver 1, however, receiver 100 does not include an interpolator such as interpolator 30. Accordingly, each of the four differential clock signals generated by DLL 20 is received by phase generator 40. The clock signals need not be differential signals according to some embodiments. Phase generator 40 generates CMOS-level sampling pulses based on the received clock signals and transmits the sampling pulses to sampler 50.

Phase generator 40 of receiver 100 may include four flip-flop sets to generate CMOS-level sampling pulses using the four received clock signals. In some of these embodiments, the architecture shown in FIG. 2 may be modified to incorporate the four flip-flop sets so as to provide sampling pulses having twice the frequency of the received clock signals.

Receiver 100 may be implemented within a fractionally-spaced equalizer, in which each bit-cell includes more than one valid bit. In such implementations, it may be beneficial to sample a data signal multiple times per bit-cell. Phase generator 40 or receiver 100 therefore uses the multiple clock phases received from DLL 20 to generate sampling pulses that allow such sampling.

Figure 6:
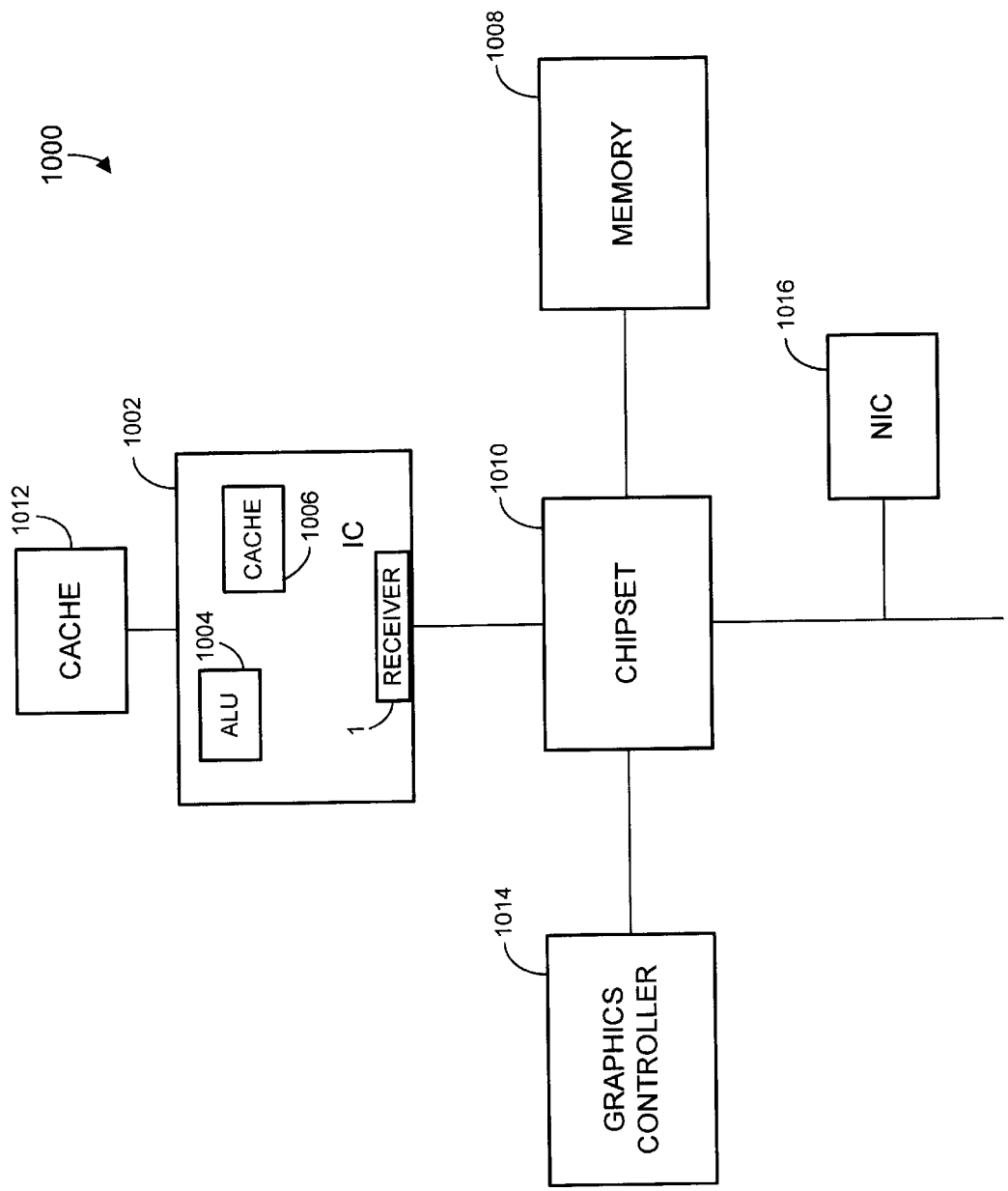
FIG. 6 is a block diagram of a system according to some embodiments.

FIG. 6 illustrates a block diagram of system 1000 according to some embodiments. System 1000 includes integrated circuit 1002 comprising sub-blocks such as arithmetic logic unit (ALU) 1004, on-die cache 1006 and receiver 1 of FIG. 1. Integrated circuit 1002 may be a microprocessor or another type of integrated circuit. Integrated circuit 1002 may also communicate with system memory 1008 via receiver 1, a host bus and chipset 1010. According to some embodiments, integrated circuit 1002 also communicates with off-die cache 1012 via receiver 1. Other off-die functional units, such as graphics controller 1014 and Network Interface Controller (NIC) 1016, may communicate with integrated circuit 1002 via appropriate busses or ports.

Thus, some embodiments may enable high-speed sampling using a low-swinging differential clock signal.

The several embodiments described herein are solely for the purpose of illustration. Some embodiments may incorporate, in part or in whole, any currently or hereafter-known DLLs, interpolators, phase generators, flip-flops, transistors and samplers. Therefore, persons skilled in the art will recognize from this description that other embodiments may be practiced with various modifications and alterations.

What is claimed is:

1. A circuit comprising:
    a first set of one or more flip-flops to receive a low-swing differential clock; and
    a second set of one or more flip-flops to receive the low-swing differential clock,
    wherein one of the one or more flip-flops of the first set is to generate a first CMOS-level sampling pulse for each cycle of the low-swing differential clock, and wherein one of the one or more flip-flops of the second set is to generate a second CMOS-level sampling pulse for each cycle of the low-swing differential clock.

2. A circuit according to claim 1, the low-swing differential clock having a first frequency and the first CMOS-level sampling pulse having a second frequency that is greater than the first frequency.

3. A circuit according to claim 1, wherein each of the first set of flip-flops is to be triggered by a first component of the differential clock signal, and wherein each of the second set of flip-flops is to be triggered by a second component of the differential clock signal.

4. A circuit according to claim 3, wherein each of the first set of flip-flops and each of the second set of flip-flops is a positive edge-triggered flip-flop.

5. A circuit according to claim 3, wherein each of the first set of flip-flops and each of the second set of flip-flops is a negative edge-triggered flip-flop.

6. A circuit according to claim 1, wherein each of the first set of flip-flops and each of the second set of flip-flops is to be triggered by a first component of the differential clock signal.

7. A circuit according to claim 6, wherein each of one of the sets of flip-flops is a negative edge-triggered flip-flop and each of the other set of flip-flops is a positive edge-triggered flip-flop.

8. A circuit according to claim 1, wherein each of the first set of flip-flops is to receive an initial state, and wherein the initial state of each of the first set of flip-flops is to be barrel-shifted through each of the first set of flip-flops.

9. A method comprising:
receiving a low-swing differential clock signal;
generating a first CMOS-level sampling pulse for each cycle of the low-swing differential clock with one of one or more flip-flops of a first set of flip-flops; and
generating a second CMOS-level sampling pulse for each cycle of the low-swing differential clock with one of one or more flip-flops of a second set of flip-flops.

10. A method according to claim 9, the low-swing differential clock having a first frequency and the first CMOS-level sampling pulse having a second frequency that is greater than the first frequency.

11. A method according to claim 9, further comprising:
triggering each of the first set of flip-flops by a first component of the differential clock signal; and
triggering each of the second set of flip-flops by a second component of the differential clock signal.

12. A method according to claim 11, wherein each of the first set of flip-flops and of the second set of flip-flops is a positive edge-triggered flip-flop.

13. A method according to claim 11, wherein each of the first set of flip-flops and of the second set of flip-flops is a positive edge-triggered flip-flop.

14. A method according to claim 9, further comprising triggering each of the first set of flip-flops and each of the second set of flip-flops by a first component of the differential clock signal.

15. A method according to claim 14, wherein each of one of the sets of flip-flops is a negative edge-triggered flip-flop and each of the other set of flip-flops is a positive edge-triggered flip-flop.

16. A method according to claim 9, further comprising:
providing an initial state to each of the first set of flip-flops; and
barrel-shifting the initial state provided to each of the first set of flip-flops through each of the first set of flip-flops.

17. A flip-flop to receive a low-swing differential clock signal and to generate a CMOS-level sampling pulse based on the low-swing differential clock signal.

18. A flip-flop according to claim 17, further comprising a first jam latch and a second jam latch coupled in a master-slave arrangement.

19. A flip-flop according to claim 18, further comprising
a first CMOS transistor, a drain of the first transistor coupled directly to the first jam latch and a gate of the first transistor to receive a first component of the differential clock signal; and
a second CMOS transistor, a drain of the second transistor coupled directly to the second jam latch and a gate of the second transistor to receive a second component of the differential clock signal.

20. A flip-flop according to claim 19, wherein a source of the first transistor is coupled to a source of the second transistor.

21. A system comprising:
a delay lock loop to receive a differential clock signal and to generate a plurality of phases of the differential clock signal;
an interpolator to receive the plurality of phases, to receive a code, and to generate a low-swing differential clock signal based on the received plurality of phases and on the received code; and
a pulse generator to receive the low-swing differential clock signal, to generate a first CMOS-level sampling pulse for each cycle of the low-swing differential clock with one of one or more flip-flops of a first set of flip-flops, and to generate a second CMOS-level sampling pulse for each cycle of the low-swing differential clock with one of one or more flip-flops of a second set of flip-flops.

22. A system according to claim 21, wherein each of the first set of flip-flops is to be triggered by a first component of the low-swing differential clock signal, and wherein each of the second set of flip-flops is to be triggered by a second component of the low-swing differential clock signal.

23. A system according to claim 21, wherein each of the first set of flip-flops and each of the second set of flip-flops is to be triggered by a first component of the low-swing differential clock signal, and wherein each of one of the sets of flip-flops is a negative edge-triggered flip-flop and each of the other set of flip-flops is a positive edge-triggered flip-flop.

24. A system comprising:
a chipset; and
a die comprising a microprocessor in communication with the chipset, wherein the microprocessor includes a receiver comprising:
a pulse generator to receive the low-swing differential clock signal, to generate a first CMOS-level sampling pulse for each cycle of the low-swing differential clock with one of one or more flip-flops of a first set of flip-flops, and to generate a second CMOS-level sampling pulse for each cycle of the low-swing differential clock with one of one or more flip-flops of a second set of flip-flops.

25. A system according to claim 24, wherein each of the first set of flip-flops is to be triggered by a first component of the low-swing differential clock signal, and wherein each of the second set of flip-flops is to be triggered by a second component of the low-swing differential clock signal.

* * * * *